United States Patent [19]

Hansen et al.

[11] Patent Number: 5,554,948

[45] Date of Patent: * Sep. 10, 1996

[54] ADAPTIVE THRESHOLD CIRCUIT WITH DECELERATION COMPENSATION

[75] Inventors: Mark C. Hansen, Ann Arbor, Mich.; Walter K. Kosiak, Kokomo, Ind.

[73] Assignee: Delco Electronics Corporation, Kokomo, Ind.

[*] Notice: The portion of the term of this patent subsequent to Oct. 17, 2012, has been disclaimed.

[21] Appl. No.: 251,499

[22] Filed: May 31, 1994

[51] Int. Cl.$^6$ ............................. G01P 3/489; H03K 5/01; H03K 9/06

[52] U.S. Cl. ............................. 327/181; 327/48; 327/86; 327/168; 327/304; 324/166; 324/173

[58] Field of Search ..................... 388/912, 811; 318/602, 603, 605; 327/74, 73, 76, 77, 78, 86, 47, 48, 49, 165, 168, 181, 291, 300, 304; 324/207.25, 173, 174, 207.15, 207.12, 160, 166

[56] References Cited

U.S. PATENT DOCUMENTS

| | | | |
|---|---|---|---|
| 3,801,830 | 4/1974 | Boyer | 307/235 R |
| 4,562,549 | 12/1985 | Tanaka et al. | 364/486 |
| 4,866,298 | 9/1989 | Kniss et al. | 307/268 |
| 4,868,498 | 9/1989 | Lusinchi et al. | 324/173 |
| 4,962,470 | 10/1990 | Hansen | 364/572 |
| 5,029,286 | 7/1991 | Kirschner | 324/173 |
| 5,144,233 | 9/1992 | Christensen et al. | 324/207.25 |
| 5,274,326 | 12/1993 | Bleckmann et al. | 324/166 |

OTHER PUBLICATIONS

David K. Long, "An Adaptive Sense Amplifier For Engine Control Applications", Paper No. 770435, Society of Automotive Engineers International Automotive Engineering Congress and Exposition, Cobo Hall, Detroit, Michigan Feb. 28–Mar. 4, 1977.

*Primary Examiner*—Toan Tran
*Attorney, Agent, or Firm*—Jimmy L. Funke

[57] ABSTRACT

An adaptive threshold circuit for use with a magnetic type of sensor that has a pick-up coil. The pick-up coil has an alternating voltage induced therein when a slot or tooth formed in a wheel rotates past the sensor. The circuit produces a square wave pulse voltage during positive half-cycles of the voltage generated in the pick-up coil. The circuit includes a digital to analog converter the input of which is connected to a selectable pulse counter. The pulse counter has a decrement function that allows for the count to be varied so as to accommodate sudden wheel decelerations. According to one embodiment, the counter may down count to reduce the count number. In accordance with a second embodiment, the counter may shift out one bit to perform a divide-by-two operation on the count number. The output of the converter is a function of the count magnitude in the counter and provides a variable threshold voltage that is compared by a voltage comparator with a voltage that is a function of the magnitude of the voltage generated in the pick-up coil. The circuit has an input circuit connected to the pick-up coil that includes a voltage attenuating circuit and a diode. The pulse count of the counter is, at times, incremented under control of a comparator that compares the output voltage of the converter with a voltage that is a function of the magnitude of the voltage generated in the pick-up coil.

21 Claims, 3 Drawing Sheets

ADAPTIVE THRESHOLD CIRCUIT WITH DECELERATION COMPENSATION

CROSS-REFERENCE TO RELATED APPLICATIONS

This is related to U.S. Pat. No. 5,459,348, filed on Dec. 17, 1993 and entitled "Adaptive Threshold Circuit", and which reference is incorporated herein.

BACKGROUND OF THE INVENTION

This invention relates generally to an adaptive threshold circuit and, more particularly, to an adaptive threshold circuit for use with magnetic or variable reluctance sensors that produce an alternating voltage in response to rotation of a wheel.

Magnetic sensors are used in automotive applications to provide timing signals for the determination of, for example, engine crankshaft position and speed, and in anti-lock brake systems for determining wheel speed. This type of sensor is located adjacent to a driven wheel that has circumferentially spaced slots or teeth. The wheel is associated with a magnetic pick-up that includes a pick-up coil and a permanent magnet. As the wheel rotates relative to the pick-up, an alternating voltage is generated in the coil.

A disadvantage of a magnetic type of sensor is that the peak voltages generated are generally proportional to the speed of rotation of the wheel. Thus, the peak voltage generated can vary, for example, from 250 millivolts (mvolts) at low speeds, to over 160 volts at higher speeds. Some sensors are rated up to 200 volts. In order to correctly decode the generated signal, the receiving circuit must adapt the threshold voltage it uses to recognize a positive or high voltage level.

As mentioned, the voltages generated in the pick-up coil are generated when a slot on the wheel moves past the sensor. Any dirt or scratches on the surface of the wheel will generate output noise that is also proportional to the speed of the wheel. At high speeds, this noise can be several volts in amplitude.

As one possible solution to the noise problem, it has been proposed to utilize an analog circuit that has adaptive threshold control. One example of such a circuit is shown in the U.S. Pat. No. issued to Christenson et al., 5,144,233, granted on Sep. 1, 1992. However, analog adaptive controls have some drawbacks. First of all, they generally require an external capacitor to store the voltage for the next threshold. The charge must be stored for several milliseconds, which requires a sizeable capacitor to maintain accuracy. Second, unwanted noise spikes in the system can modify the charge stored on the capacitor. This in turn causes inaccuracies with the next input switchpoint. Third, since the circuit is mostly an analog circuit, processing variations will tend to cause large parametric changes in operation of the circuit.

The above-referenced related application entitled "Adaptive Threshold Circuit" to which this invention shares the same inventor and assignee is directed to solving the above-cited drawbacks. In doing so, the above cited approach employs a digital to analog converter coupled to a pulse counter which is made up of a number of interconnected flip-flops for performing a sequential counting operation. The interconnected flip-flops produce a count which is a function of the peak voltage detected. The converter then produces an output that is a function of the count magnitude in the counter and which is used to provide a threshold voltage. The threshold voltage is then compared with a voltage representative of the sensor output to achieve a square wave voltage.

As previously mentioned, peak voltages are generated from the magnetic sensor that can vary from millivolts at low speeds to hundreds of volts at high speeds. During constant speeds, the time between input pulses is generally fixed and the adaptive threshold circuit may accommodate the input threshold voltage. However, in order to accommodate sudden changes in amplitude such as those associated with quick decelerations, it may be desirable to modify the threshold voltage when changes in speed are expected, so that sudden changes in wheel speeds do not go undetected.

SUMMARY OF THE INVENTION

One of the objects of the present invention is to provide an adaptive threshold circuit that, for the most part, is digital in nature and does not require a capacitor of the type used in analog threshold circuits and is therefore less sensitive to processing variations.

Still another more specific object of this invention is to provide an adaptive threshold circuit that includes an adaptively selectable pulse counter and a digital-to-analog converter having input terminals connected to the counter. The output voltage of the converter provides a threshold voltage level that is a function of the count magnitude in the counter and which is applied to a voltage comparator that compares the threshold voltage to a voltage that is a function of the magnitude of the voltage generated in the pick-up coil of a magnetic sensor.

More specifically, an adaptive threshold circuit made in accordance with this invention includes an input circuit connected to the pick-up coil of the sensor that has a diode and a resistive voltage divider or attenuating circuit. The anode of the diode is connected to one side of the pick-up coil through a resistor. The circuit further has four voltage comparators, an adaptively selectable pulse counter and a digital-to-analog converter that produces an output voltage that is a function of the count in the counter. In one embodiment, the pulse counter has an up/down counter that may be selectively counted down to provide a reduced count output. In a second embodiment, the pulse counter may have an up-counter-with-shift in which one or more binary bits may be shifted out of the counter to provide successive divide-by-two count outputs. The selectably reduced count output produces a reduced threshold voltage when wheel 10 undergoes rapid decelerations. The circuit produces a square wave voltage during a positive half-cycle of the voltage generated in the pick-up coil. This square wave voltage has a leading rising edge and a trailing falling edge. The first comparator compares a fixed reference voltage to a voltage that is a function of pick-up coil voltage to produce the trailing falling edge when a positive half-cycle voltage is decreasing toward zero. The second comparator compares a voltage at the anode of the diode with the output voltage of the digital-to-analog converter to produce the leading rising edge when the voltage at the cathode of the diode exceeds the output voltage of the converter during a positive half-cycle of the pick-up coil voltage. The third comparator operates like the second comparator, except that it compares the voltage at the cathode of the diode with the output voltage of the digital-to-analog converter. The fourth comparator may be termed a counter pulse incrementing comparator. It compares the voltage at a junction of the voltage divider with the output voltage of the converter and when the voltage at the voltage divider junction is greater than the output voltage of the converter, the comparator output causes the circuit to operate to cause clock pulses to be applied to the counter, thereby incrementing the pulse count of the counter and, accordingly, the output voltage of the converter. When sudden wheel decelerations are detected, the pulse count may be selectively reduced. This reduces the threshold voltage which helps to ensure that the peak pick-up coil voltage does not drop below the threshold voltage and thereby go undetected.

These and other aspects and advantages of the present invention may be best understood by reference to the following detailed description of the preferred embodiments when considered in conjunction with the accompanying drawings.

DETAILED DESCRIPTION OF THE PREFERRED EMBODIMENTS

This invention will be described for use in controlling a distributorless ignition system for a spark ignited internal combustion engine. It is to be understood, however, that the use of this invention is not restricted to ignition systems but could have other uses, for example, sensing wheel speed in anti-lock brake systems.

Figure 1A:
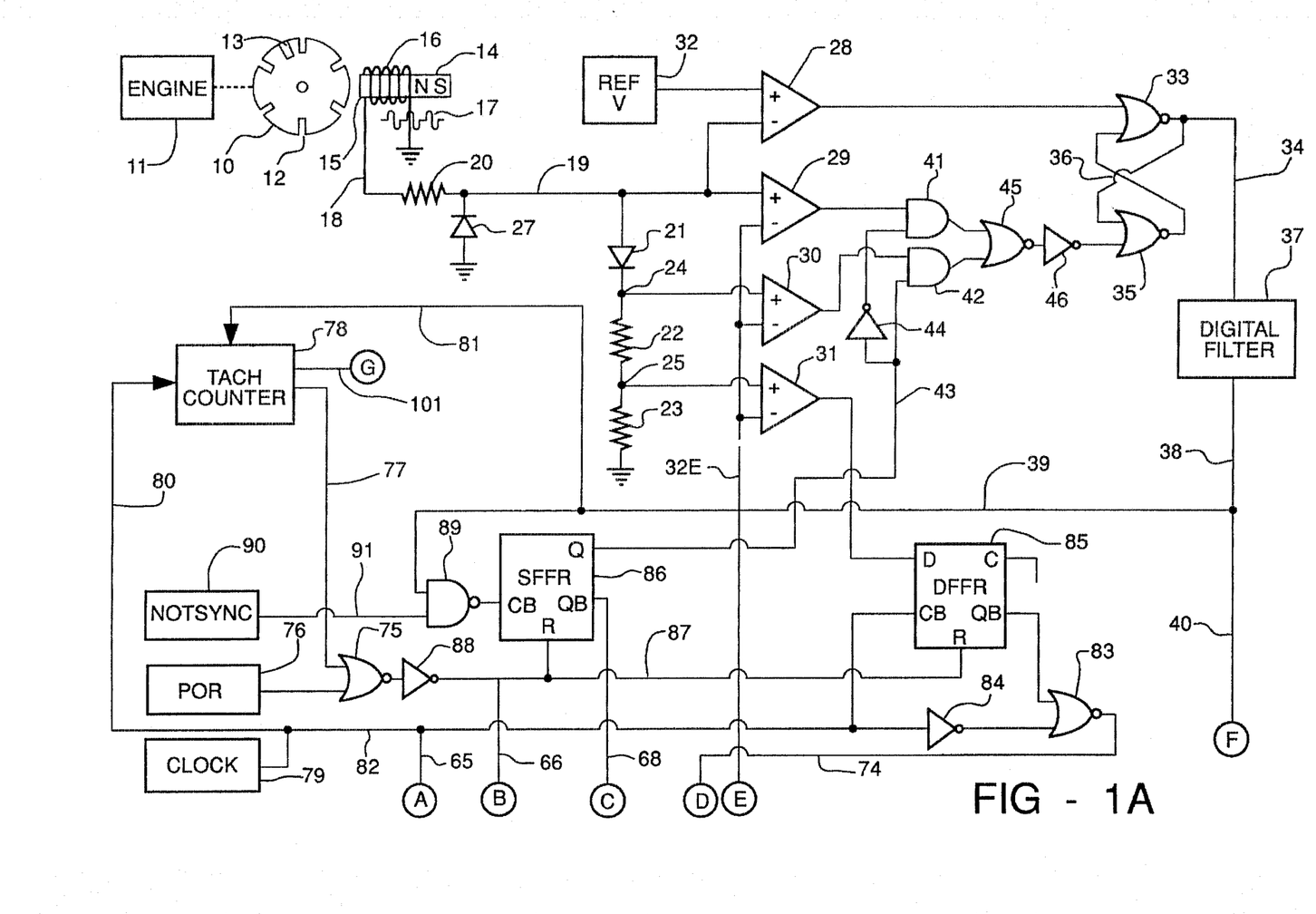
FIGS. 1A and 1B when taken together illustrate an adaptive threshold circuit made in accordance with one embodiment of the present invention that is connected to a magnetic pick-up coil.
Figures 1B, 2:
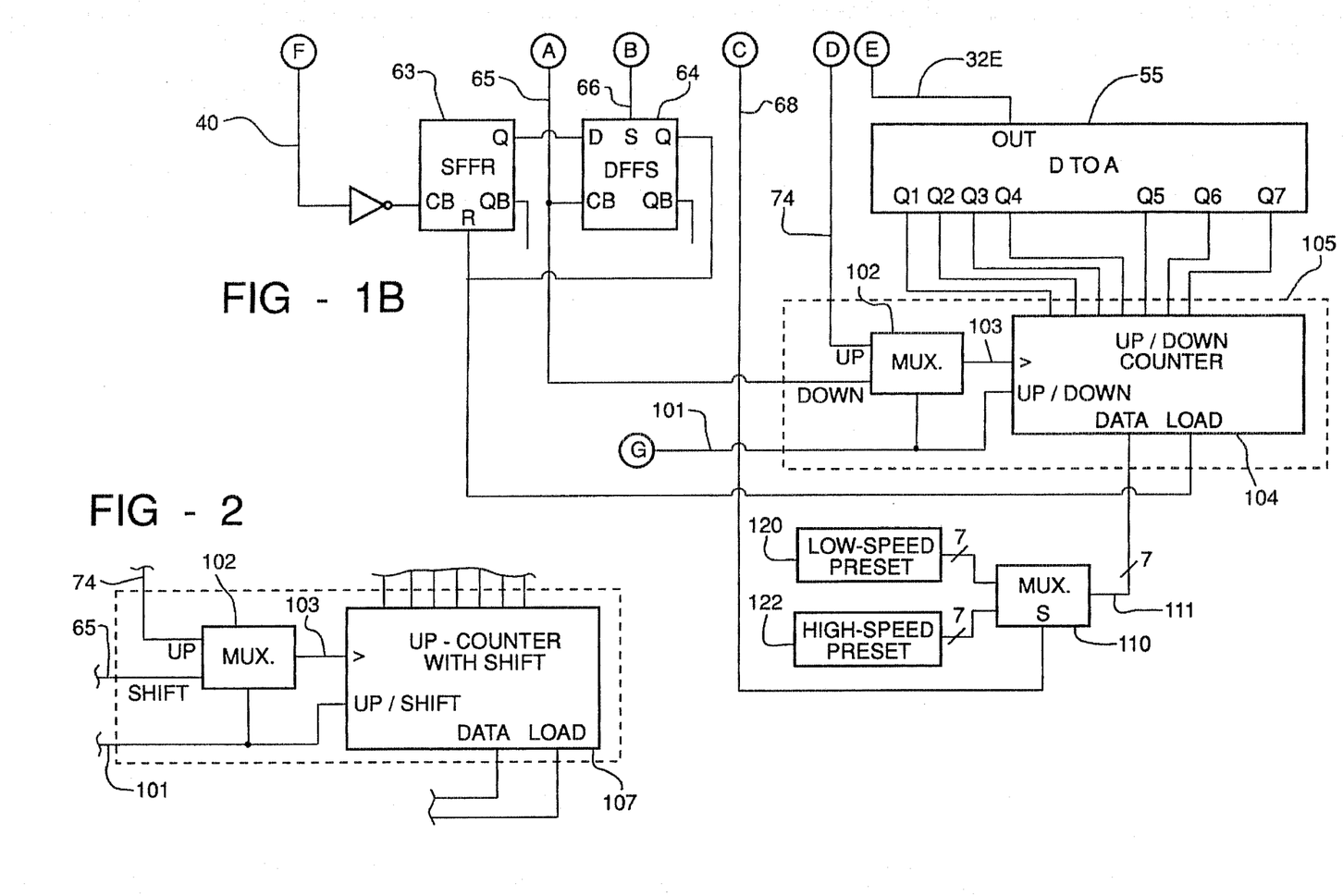
FIG. 2 illustrates an alternate embodiment of the adaptive threshold circuit shown in FIG. 1B according to a second embodiment of the present invention.

In regard to the drawings, the system is shown according to one embodiment in FIGS. 1A and 1B and a second embodiment according to the changes found in FIG. 2. It is to be understood that the circles A–G in FIGS. 1A and 1B are electrically connected together.

Referring now to FIG. 1A, the reference numeral 10 designates a wheel that is driven by the crankshaft of a spark ignited internal combustion engine 11. The wheel 10 has six slots or teeth that are spaced from each other by sixty angular degrees. One of these six slots is designated as 12. The wheel has a seventh slot designated as 13 which is located at ten angular degrees from one of the sixty degree slots. The slot 13 is provided to develop a voltage that is used to synchronize a distributorless ignition system in a manner known to those skilled in the art. In a wheel speed application for anti-lock brake systems, a slot like 13 would not be used, that is, the slots would all be equally spaced.

Disposed adjacent the outer periphery of wheel 10 is a variable reluctance magnetic pick-up or magnetic sensor. This pick-up comprises a permanent magnet 14 and a core 15 that is formed of magnetic material. A pick-up coil 16 is wound on core 15. As a slot on wheel 10 rotates past the end of core 15, an alternating voltage is induced or generated in pick-up coil 16. The voltage waveform generated in coil 16 is comprised of a series of alternating voltages as shown by waveform 17 in FIG. 1A. Waveform 17 shows three consecutively occurring alternating voltages which represents the passage of three slots past the end of the sensor. Each alternating voltage that is generated occurs at predetermined angularly spaced positions of the engine crankshaft.

One side of pick-up coil 16 is connected to ground and its opposite side is connected to conductor 18. Conductor 18 is connected to a conductor 19 through a 40K ohm resistor 20.

Connected between line 19 and ground is a series circuit comprised of a p-n junction semiconductor diode 21 and resistors 22 and 23. Diode 21 does not conduct in a forward direction until the forward voltage applied thereto exceeds about 0.7 volts. Resistor 22 may have a resistance of about 1920 ohms and resistor 23 a resistance of about 1080 ohms. The cathode of diode 21 and one side of resistor 22 are connected to a junction or node 24. The resistors 22 and 23 are connected to a junction or node 25. A clamping diode 27 is connected between conductor 19 and ground.

The system of this invention has four voltage comparators designated respectively as 28, 29, 30 and 31. The positive input terminal of comparator 28 is connected to a source of direct reference voltage 32. The positive input terminal of comparator 29 is connected to conductor 19. The positive input terminal of comparator 30 is connected to junction 24 and the positive input terminal of comparator 31 is connected to junction 25. The negative input terminals of all the comparators 29–31 are connected to a conductor 32E. The negative input terminal of comparator 28 is connected to conductor 19.

The output terminal of comparator 28 is connected to one input of a NOR gate 33. The output of NOR gate 33 is connected to a conductor 34. NOR gate 33 is connected to NOR gate 35 and gates 33 and 35 are connected to form a latch circuit designated as 36.

The conductor 34 is connected to the input of a digital filter 37. Filter 37 can be of the type shown in the U.S. Pat. No. to Hansen 4,962,470 granted on Oct. 9, 1990. The output of digital filter 37 is connected to conductors 38, 39 and 40.

The output of comparator 29 is connected to one input of an AND gate 41. The output of comparator 30 is connected to one input of AND gate 42. The other input of AND gate 42 is connected to conductor 43. The conductor 43 is connected to one of the inputs of AND gate 41 through an invertor 44. The output of AND gates 41 and 42 are connected respectively to inputs of a NOR gate 45. The output of NOR gate 45 is connected to one input of NOR gate 35 through an invertor 46.

Referring now to FIG. 1B, the system includes a digital pulse counter 105 which according to one embodiment of the present invention has an up/down pulse counter 104 operatively coupled to a multiplexer 102. The up/down pulse counter 104 is a seven-bit binary counter known and readily understood to one skilled in the art. Counter 104 may include a 74193 counter or other similar binary counters. The multiplexer may include a commercially available 74157 multiplexer. The counter 104 includes a load input connected to line 70 and a data input connected to line 111, both of which are used for presetting the counter 104. Line 111 is output from a second multiplexer 110 which in turn receives a select input signal via line 68. The second multiplexer 110 has a low speed preset input for receiving low-speed preset data 120 and a high speed preset input for receiving high-speed preset data 122 to preset the initial count in the counter 104. In addition, up/down counter 104 has an up/down input connected to line 101 which originates from an output of tachcounter 78.

Additionally, the up/down counter 104 further has an input connected to a multiplexer 102 via line 103. Multiplexer 102 has a pair of inputs of which one is connected to line 74 for receiving an up count signal and the other input is connected to line 65 for receiving a down count signal. Multiplexer 102 also has a select input connected to line 101 for timing the transmission of up count or down count signals to counter 104.

The up/down counter 104 produces a seven-bit binary number in response to well-known binary counting schemes. The binary count number is supplied to the input terminals Q1 through Q7 of the digital to analog converter 55. Accordingly, counter 104 may provide a binary count of between 0 and 127. This type of counter 104 further provides the ability to generate a variable count number by performing a down count on an existing count. Essentially, multiplexer 102 selects between an up count signal on clock line 74 or a down count signal on line 65 based on input line 101 which communicates the output of tachcounter 78. Tachcounter 78 will produce a "high" signal on line 101 for one clock period for each selected time interval such as 40 clock cycles, for example, over which a new sensor voltage pulse may not be detected. The multiplexer 102 outputs the appropriate signal to line 103 while line 101 further provides a periodic high pulse for the duration of one clock 79 period. When line 101 selects line 65, counter 104 is instructed to down-count by one count. Otherwise, line 74 is selected and counter 104 is selected to up-count.

According to an alternate embodiment of the present invention, a binary up-counter-with-shift 107 may be employed as shown in FIG. 2 in lieu of the up/down counter 104. According to this arrangement, the binary up-counter-with-shift 107 is essentially a divide-by-two binary counter known and readily understood to one skilled in the art. One in the art should find it easy to set up or create an up-counter which has a shiftable bit arrangement. Up-counter 107 has similar inputs and outputs which are connected to the same lines as the up/down counter 104 described above. The use of an up-counter-with-shift provides the ability to shift the counter output over one or more bit positions which effectively divides the counter output value by two with each shift. For instance, data lines Q7–Q1 having for example a binary value 1000000 (decimal value of 64) may be shifted once to a binary value 0100000 (decimal value of 32). This essentially reduces the threshold voltage produced by the analog-to-digital converter 55 by one-half and therefore quickly reduces the adaptive threshold voltage to ensure that rapid decelerations of wheel 10 do not go undetected.

Referring back to FIG. 1B, the digital-to-analog converter 55 converts a binary multi-bit digital signal applied to the input terminals Q1–Q7 into an analog direct voltage that is applied to conductor 32E from the output terminal designated as OUT. As previously described, the analog voltage applied to line 32E is applied to the negative input terminals of comparators 29–31 shown in FIG. 1A.

As previously described, the digital pulse counter 105 provides at its Q output terminals a multi-bit digital signal that represents the count generated in the counter. This multi-bit digital signal is applied to the input terminals Q1–Q7 of the digital-to-analog converter 55.

The digital-to-analog converter 55 is of a known type readily understood to one skilled in the art and is comprised of a plurality of resistors that are connected in a ladder network. The digital-to-analog circuitry further includes logic switching circuitry for switching in various arrays of resistors in response to the multi-bit digital signal applied to the converter input. The output voltage on line 32E is therefore a direct analog voltage that is a function of the multi-bit digital input signal.

The system has flip-flops 63 and 64 shown in FIG. 1B. Flip-flop 63 is a D flip-flop with the D input tied high which is known as a set flip-flop. The SFFR symbol on flip-flop 63 indicates that flip-flop 63 is a set flip-flop with reset. Flip-flop 64, which is labelled DFFS, is a D flip-flop with direct set.

The Q output terminal of flip-flop 63 is connected to the D terminal of flip-flop 64. The CB terminal of flip-flop 64 is connected to conductor 65. The CB terminal of flip-flop 63 is connected to conductor 40 through an invertor. The set terminal S of flip-flop 64 is connected to conductor 66.

The Q output terminal of flip-flop 64 is connected to the reset terminal R of flip-flop 63 and is also further connected to conductor 70. Conductor 70 is connected to one input of pulse counter 104 or 107.

Referring now back to FIG. 1A, the system also includes a NOR gate 75. One of the inputs of NOR gate 75 is connected to a power-on reset circuit 76. The power-on reset circuit develops an output voltage that goes high, for example, when the ignition switch on a motor vehicle is moved to a closed position. The other input of NOR gate 75 is connected to conductor 77 that has a low speed voltage pulse applied thereto when engine speed is below a predetermined value. The low speed pulse is generated by a tachcounter 78. The tachcounter 78 is connected to a source of constant frequency clock pulses 79 by line 80. The tachcounter 78 is also connected to the output of digital filter 37 by conductors 38, 39 and 81. The tachcounter 78 counts the constant frequency clock pulses at a fixed rate. The tachcounter 78 is reset to zero at each falling edge of a pulse from the digital filter 38. As the engine speed decreases, the tachcounter 78 has more time to count. If the tachcounter reaches a predetermined count, a low speed pulse is generated and applied to NOR gate 75 via conductor 77. A fundamental relationship exists between the peak voltage generated in coil 16 and engine speed. The actual low speed at which the low speed pulse is developed is determined by what voltage peak should be seen on the coil 16 given coil loading.

The clock 79 is connected to conductor 82. Conductor 82 is connected to conductor 65 and is connected to one input of a NOR gate 83 through invertor 84. The output of NOR gate 83 is connected to conductor 74. Conductor 82 is also connected to the CB input of a flip-flop 85. The flip-flop 85 is a D flip-flop with a direct reset and hence has been labelled as DFFR. The D terminal of flip-flop 85 is connected to the output of voltage comparator 31. The QB output of flip-flop 85 is connected to one of the inputs of NOR gate 83.

The system has a flip-flop 86 which is of the same type as flip-flop 63. The Q output terminal of flip-flop 86 is connected to conductor 43. The QB terminal of flip-flop 86 is connected to conductor 68. The reset terminals R of flip-flops 85 and 86 are connected to conductor 87. The conductor 87 is connected to the output of NOR gate 75 through an invertor 88.

The CB terminal of flip-flop 86 is connected to the output of a NAND gate 89. One of the inputs of NAND gate 89 is connected to the output of digital filter 37 by conductors 38 and 39. The other input of gate 89 is connected to a NOTSYNC circuit 90 by conductor 91. The output of circuit 90 is low until synchronization is achieved. Synchronization is achieved after the ten degree slot 13 passes the magnetic sensor. Synchronization refers to setting or enabling the proper ignition coil in a distributorless ignition system.

Figure 3:
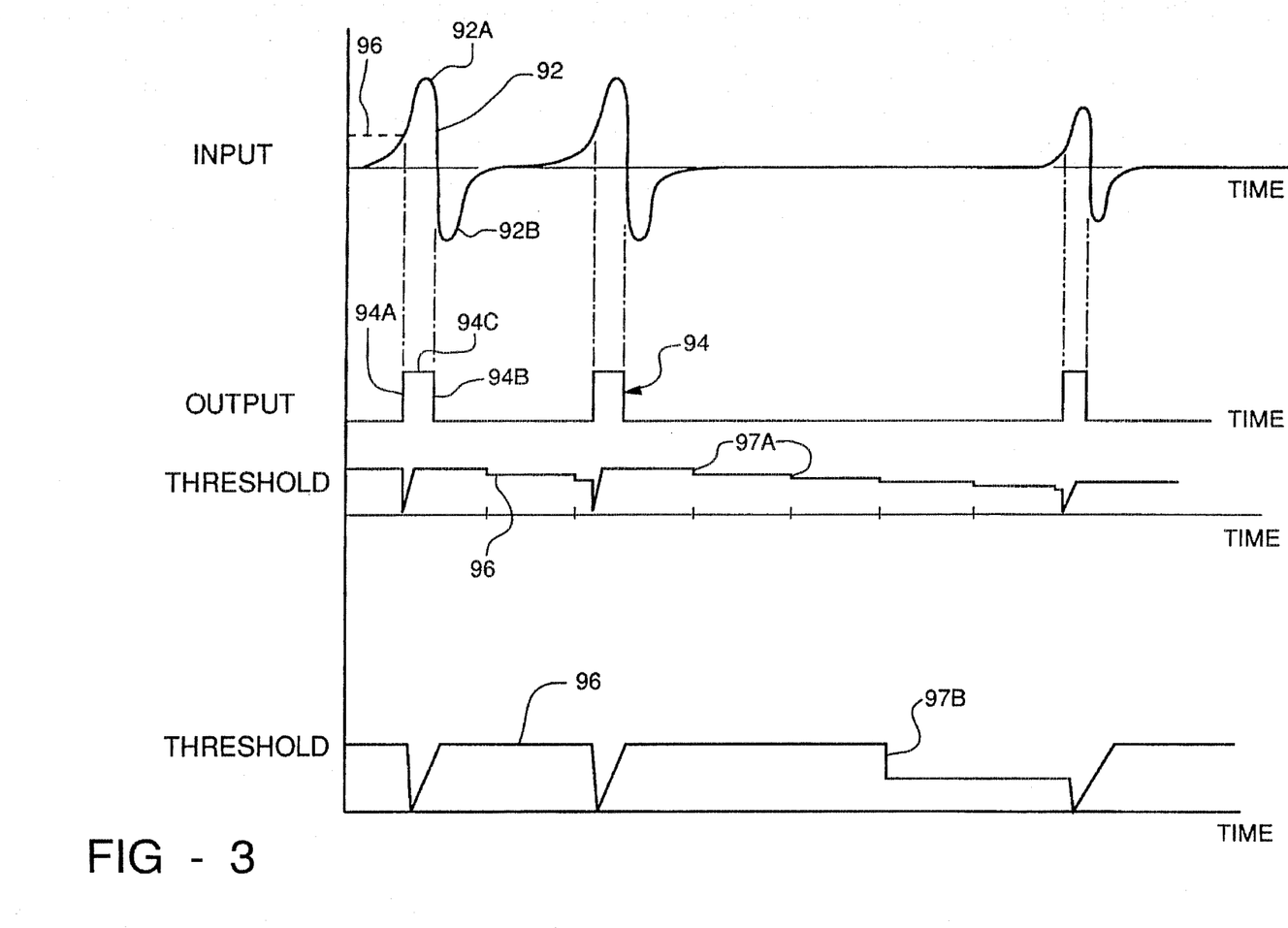
FIG. 3 illustrates waveforms that relate to the operation of the circuit of this invention.

Before proceeding to a detailed description of the operation of this invention, a general description of the operation will now be given with reference to FIG. 3. In FIG. 3, reference numeral 92 designates an alternating voltage that is induced in pick-up coil 16 as one of the slots on wheel 10 passes the magnetic sensor. This voltage has a positive half-cycle 92A and a negative half-cycle 92B. The term "P" voltage, as used hereinafter, means the positive half-cycle voltage 92A that appears on conductor 18. FIG. 3 also shows a square wave pulse 94 which has a leading rising edge 94A and a trailing falling edge 94B. Square wave pulse 94 appears at conductor 34, that is, at the output of latch 36. Also shown in FIG. 3 is a trigger or threshold voltage level 96. Threshold voltage level or magnitude 96 corresponds to the output voltage of digital-to-analog converter 55. This level will vary depending upon the magnitude of the output voltage of converter 55.

The waveforms of FIG. 3 are not to be taken as indicative of the actual magnitude or shape of the voltages developed by the system of this invention, but are generalized waveforms to aid in explaining the operation of this invention.

As an alternating voltage 92 is generated, the beginning of the positive half-cycle increases in a positive direction and when it reaches the trigger or threshold level 96, latch 36 is switched to a state to cause the rising edge 94A of square wave 94 to be developed. Square wave 94 now remains at a high level 94C until the positive half-cycle 92 decreases to a certain level whereupon the falling edge 94B is developed. This level is shown as zero voltage in FIG. 3. This level will depend on the magnitude of the reference voltage 32 which may be in a range of ground voltage to 100 mvolts.

The present invention has the ability to decrease the threshold level 96 in order to accommodate sudden decelerations of wheel 10. This is accomplished by monitoring the time interval between voltage cycles. According to the preferred embodiment, a threshold voltage level 96 drop occurs at selected time intervals as shown by voltage drop 97A which corresponds to a voltage drop equivalent to one binary count of the counter. According to the alternate embodiment, a larger voltage drop occurs as shown by 97B to provide a divide-by-two function in response to the shifting out of operation one bit of the counter 107.

A more detailed description of the operation of this invention will now be given. Assume that the input voltage generated by coil 16 is low and the system is just powering-up. The POR signal from POR 76 will initialize all flip-flops to a known state. The digital-to-analog converter 55 will be set to a count that generates the first switchpoint threshold to be used, for example, 180 mvolts. Since the flip-flop 86 is reset, Q output of flip-flop 86 is low. This enables the comparator 29 to set the output latch 36 when the P input signal rises. If the flip-flop 86 is clocked high so that the Q output thereof goes high, the comparator 30 will be enabled to set the output latch 36 to a high level.

During low speed operation, the P input voltage peaks remain low. Diode 21 does not conduct at these low voltages so the input signal is not attenuated through resistors 22 and 23. The full voltage is seen at the positive input of comparator 29 and 0 volts is seen below diode 21 at its cathode. As the P input voltage peaks increase (over 0.7 volts), the diode 21 conducts at these peaks and the signal becomes attenuated through resistors 20, 22 and 23. The voltage at junction 25 becomes the percentage of the peak voltage used to determine the next threshold level. The fixed voltage drop across the diode 21 though causes too much error if the peak voltage is taken from above diode 21 at its anode. To be accurate, the voltage below the diode 21 at its cathode should be used when the voltage at junction 25 is used. At low speeds, there is no signal below the diode 21 at its cathode. The diode 21 is needed because the 200 mvolt signals can not be attenuated but the 200 volt signals must be attenuated.

As mentioned, at speeds in which the diode does not conduct, the input P voltages are low, the comparator 29 is used and the circuit operates at a fixed threshold level determined by the POR preset level of the converter 55. When the P input level becomes greater than the converter reference level, the output of comparator 29 goes high. This, in turn, sets the output latch 36 to a high level (29 is routed to the output through the complex gate comprised of gates 41, 42 and 45. As the P input voltage falls, the comparator 29 will switch back low, but the latch 36 will remain set to a high level in the memory state. When the P input voltage falls below the lower reference voltage 32 (set between ground and 100 mvolts), the comparator 28 switches high and the output latch 36 is reset to the low state. Subsequent P input voltages cause the same sequence of events to occur.

At higher speeds, the P input voltages are attenuated and the comparator 30 is used to determine the high level threshold switchpoint. Several conditions must be met to switch the flip-flop 86 to the high state. Let us assume at this time these conditions have been met and the flip-flop 86 output Q is in the high state. This changes two things. First, as mentioned, the comparator 30 is gated to allow the setting of latch 36. The comparator 29 is not looked at. Second, the pulse counter 105, when reset, is not preset to a count which generates 180 mvolts out of converter 55 (on line 32E) as before, but is reset to its minimum count producing 20 mvolts on line 32E. The operation of the circuit is the same as in the previous paragraph, but the P input voltage is attenuated and the comparator 30 is being used. Also, the comparator 31 is being used to keep the converter 55 updated by changing the count generated in the pulse counter 105.

Assume that the output voltage of converter 55 is 380 mvolts (a count of nine). When the attenuated P input voltage reaches 380 mvolts, comparator 30 switches high and the output of latch 36 switches high. This happens when the P input voltage reaches 6.15 volts. Since resistor 20=40K ohms, resistor 22=1920 ohms, resistor 23=1080 ohms and Vdin=0.7 volts, P×(3000/43000)−0.7=0.380, and therefore P=6.15 volts. The voltage at junction 25 is 36% of the 380 mvolts, or 136 mvolts. It is desired that the adaptive threshold voltage be centered around 36% of the P inputs peak voltage. The input voltage continues to rise. Assume it goes to 18.2 volts. The voltage above resistor 22 becomes 1.22 volts and the voltage at junction 25 becomes 440 mvolts. Since 440 mvolts is greater than the 380 mvolts coming out of the converter 55, comparator 31 switches high.

Whenever the output of comparator 31 is high, the pulse counter 105 is allowed to increment its count. Accordingly, the converter 55 changes in 40 mvolt steps for each count increment. Therefore, in the above example, the pulse counter 105 would count two times, producing 420 mvolts and then 460 mvolts on line 32E. At this time, the comparator 31 would switch back low and the output of converter 55 would remain at its level of 460 mvolts. The new threshold for the next P input signal would be 460 mvolts or externally 7.29 volts. Given the same peak of 18.2 volts, the switchpoint would be 40% (7.29V/18.2V).

The timing for the previous example of counting two clock pulses will now be described. Comparator 31, flip-flop 85 and gate 83 control the clocking of the pulse counter 105 connected to the converter 55. The output of comparator 31 goes high because the voltage at junction 25 reaches 440 mvolts. The converter was outputting 380 mvolts. The first falling edge of a clock pulse from the system clock 79 causes the flip-flop 85 to clock high. While flip-flop 85 is in the high state, the clock will follow as an inverted clock signal. Therefore, the first rising edge of a clock pulse will advance the converter 55 to 420 mvolts and the second clock pulse will advance it to 460 mvolts. A short time later, the output of comparator 31 will go low. The next falling edge of the clock pulse will cause the flip-flop 85 to clock low, disabling further clocks.

Flip-flops 63 and 64 form a synchronous one-shot that is responsible for resetting the pulse counter 105 for the converter 55. The output of the one-shot is the signal on the Q terminal of flip-flop 64. In this implementation, a pulse on line 70 coming from flip-flop 64 loads the pulse counter with the value on bus 111. The flip-flop 86 determines if bus 111 coming from multiplexer 110 has the high-speed preset value 122 or the low-speed preset value 120. According to this implementation, the high-speed preset 122 is a count of zero, producing an output of twenty mVolts from converter 55 on line 32E. The low-speed preset 120 may be a count of four, producing an output of 180 mVolts on line 32E. The flip-flop 86 determines if the P input signal should be looked at above or below the diode 21 ( i.e., at its anode or cathode, respectively).

Three events will cause the pulse counter 105 connected to converter 55 to be reset (or preset): a POR condition; a determination of low speed; or a high level transition of the digital filter output. As mentioned above, a POR condition will initialize every flip-flop in the circuit to a known state. During a POR, the flip-flop 86 is reset and the flip-flop 64 is set. Flip-Flop 64 being high loads the low-speed preset value into the counter. The counter results with a count of four and the converter 55 outputs 180 mvolts. If at any time a low speed pulse is seen, the counter is preset just as in the POR condition.

In regard to the operation of the synchronous one-shot, a POR or low speed pulse will set the flip-flop 64. This, in turn, resets the flip-flop 63 (it might already be low). At the next falling edge of a clock pulse, the low level of flip-flop 63 will cause the flip-flop 64 to clock low, releasing the flip-flop 63 from the reset condition.

If a high level transition of the digital filter output occurs, the flip-flop 63 will clock high. At the next falling edge of a clock pulse, the high level of the Q output of flip-flop 63 will cause the flip-flop 64 to clock high which then resets the flip-flop 63. The next falling edge of a clock pulse causes the flip-flop 64 to clock back low, releasing the flip-flop 63 from the reset condition.

In the last case, the flip-flop 86 might be in the high state in which the flip-flop 64 pulse will load the high-speed preset value into the pulse counter 105 and the converter 55 will output 20 mvolts.

The purpose of the low speed signal (line 77) and the NOTSYNC signal (line 91) is to clock or reset the flip-flop 86 to a low state when low speed or out-of-sync conditions are found.

To further explain the operation of this invention for control of engine ignition systems, assume equal spacings of wheel slots with one extra slot for engine synchronization. Assume that a POR condition has occurred and the system is ready to be synchronized at the next input pulse, which is a synchronizing pulse. The POR condition resets the flip-flop 86 and the converter counter for low speed or fixed threshold operation. It is assumed that if the P input peak voltages are low, then a fixed threshold of 180 mvolts should be used. In the first two pulses, this fixed input threshold is used. Since the system has not yet synchronized, the NOTSYNC signal is low. At the first regular input pulse after synchronization, the output of digital filter 37 (rising edge) clocks the flip-flop 86 high. The circuit uses the fixed threshold to determine when this P input pulse goes high, but now the circuit assumes high speed operation and calculates the next P input threshold based on the percentage of this input voltage. If a low speed pulse occurs, this assumption proves to be wrong and the circuit is reset to once again assume low speed operation at a fixed threshold. The next P input pulse that passes the fixed threshold voltage level is then again treated as a high speed pulse. If no low speed pulse occurs, the percentage of this peak level is used as a threshold to switch the next pulse to a high level.

Whenever sudden decelerations of wheel 10 are detected, the threshold voltage level 96 is reduced by a selected amount. Decrements in the threshold voltage 96 may occur repeatedly until a voltage pulse is detected. Accordingly, the use of a variable counter enables one to achieve a variable threshold voltage which helps prevent sudden wheel decelerations from going undetected.

The following is a summary of the operation of this invention. The purpose of voltage comparator 28 is to cause, when it switches, the development of falling edge 94B shown in FIG. 3. Comparator 28 compares the voltage on conductor 19 with the reference voltage 32.

The comparator 29 is used during low speed rotation of wheel 10. The purpose of this comparator is to cause the development of rising edge 94A when the voltage on conductor 19 exceeds the threshold voltage developed by converter 55, which is applied to an input of comparator 29 by conductor 32E.

The comparator 30 is used for higher speeds of rotation of wheel 29. The purpose of this comparator is to cause the development of rising edge 94A, when the voltage at junction 24 exceeds the threshold voltage developed by converter 55, which is applied to an input of comparator 30 by conductor 32E.

The purpose of comparator 31 is to cause the pulse count of the pulse counter 105 connected to converter 55 to be incremented when the voltage at junction 25 exceeds the output voltage of converter 55 on conductor 32A.

The digital filter 37 filters the square wave voltage developed on line 34 as described in the above-referenced patent to Hansen, U.S. Pat. No. 4,962,470. FIGS. 2 and 3 of that patent illustrate some possible input and output waveforms related to the digital filter.

During high speed operation, the rising leading edge of the square wave output pulse on line 38 causes the high-speed preset value 122 to be loaded into the pulse counter 105 with a minimum count. When this counter is reset, the output voltage of converter 55 on conductor 32E is 20 mvolts.

When the counter connected to converter 55 is preset with the low-speed preset value 120, such as during a power on reset condition, the output voltage of converter 55 is preset to 180 mvolts.

If sudden decelerations occur, the threshold voltage level 96 is reduced in order to ensure that sudden decelerations of wheel 10 do not go undetected.

The output of the circuit that has been described is taken from conductor 38. Thus, the circuit that uses the information developed by the circuit of this invention is connected to line 38.

Thus, the aforementioned description of the preferred embodiments of the invention is for the purpose of illustrating the invention, and is not to be considered as limiting or restricting the invention, since many modifications may be made by the exercise of skill in the art without departing from the scope of the invention.

The embodiments of the invention in which an exclusive property or privilege is claimed are defined as follows:

1. Apparatus for developing a series of square wave voltage pulses that are developed during rotation of a rotatable wheel comprising:

a magnetic sensor associated with said wheel and having a pick-up coil and means on said wheel for causing an alternating voltage to be generated in said pick-up coil when said wheel rotates relative to said sensor;

an input circuit connected to said pick-up coil;

a digital-to-analog converter having an input and an output for providing a threshold voltage;

a voltage comparator having a first input connected to said input circuit and a second input connected to the output of said converter;

a pulse counter for developing a digital count signal to be input to said converter and having a selectable count register that may be decremented to reduce the digital count signal;

means responsive to the rotation of said wheel for detecting deceleration of said wheel and providing a detected deceleration output signal indicative thereof;

means responsive to said detected deceleration output signal for decrementing said counter to reduce said threshold voltage;

an output circuit for providing a series of said square wave voltage pulses; and means coupled to the output of said comparator for causing a leading rising edge of said square wave voltage pulse to be developed at said output circuit when the voltage generated in said coil increases to a value that has a predetermined relationship to the output voltage of said converter.

2. The apparatus according to claim 1 wherein the pulse counter for developing the digital count signal is a binary up/down pulse counter which executes binary down count operations so as to reduce the threshold voltage when deceleration of the wheel is detected.

3. The apparatus according to claim 1 wherein the pulse counter for developing the digital count signal is a binary counter with a binary shift operation wherein a bit shift is executed so as to reduce the threshold voltage when deceleration of the wheel is detected.

4. The apparatus according to claim 1 wherein the means for providing the digital signal includes means for presetting the digital count signal to a predetermined value.

5. The apparatus according to claim 1 wherein the pulse counter is connected to a source of clock pulses, and said means coupled to the output of said comparator causes clock pulses to be applied to said counter to increment the count in said counter.

6. The apparatus according to claim 1 wherein said wheel is driven by an internal combustion engine.

7. The apparatus according to claim 1 wherein the means on said wheel for causing an alternating voltage to be generated comprises circumferentially spaced slots formed in said wheel.

8. The apparatus according to claim 1 wherein a digital filter circuit is provided that has an input connected to said output circuit, said digital filter circuit having an output that is adapted to be connected to a circuit to be controlled.

9. Apparatus for developing a series of square wave voltage pulses that are developed during rotation of a rotatable wheel comprising:

a magnetic sensor associated with said wheel having a pick-up coil and means on said wheel for causing an alternating voltage to be generated in said pick-up coil when said wheel rotates relative to said sensor;

an input circuit connected to said pick-up coil;

an output circuit;

a digital-to-analog converter having an input and an output for providing a voltage threshold;

a first comparator having a first input connected to said input circuit and a second input connected to the output of said convertor;

a second voltage comparator having a first input connected to the input circuit and a second input connected to a reference voltage;

means responsive to the rotation of said wheel for detecting deceleration of said wheel and providing a detected deceleration output signal indicative thereof;

a binary pulse counter for developing a digital count signal and for applying said digital count signal to the input of said converter, said counter having a selectable count that may be reduced in response to the detected deceleration output signal to reduce the threshold voltage to accommodate decelerations of the wheel;

means coupled to an output of said first comparator for causing a leading rising edge of said square wave voltage pulse to be developed at said output circuit when the voltage generated in said coil increases to a value that has a predetermined relationship to the output voltage of said converter; and means coupled to the output of said second comparator for causing a trailing falling edge of said square wave pulse to be developed at said output circuit when the voltage generated in said coil decreases to a value that has a predetermined relationship to the magnitude of said reference voltage.

10. The apparatus according to claim 9 wherein the pulse counter for developing the digital count signal is a binary up/down pulse counter which executes binary down count operations so as to reduce the threshold voltage when deceleration of the wheel is detected.

11. The apparatus according to claim 9 wherein the pulse counter for developing the digital count signal is a binary counter with a binary shift operation wherein a bit shift is executed so as to reduce the threshold voltage when deceleration of the wheel is detected.

12. Apparatus for developing a series of square wave voltage pulses that are developed during rotation of a wheel comprising:

a magnetic sensor associated with said wheel having a pick-up coil and means on said wheel for causing an alternating voltage to be generated in said pick-up coil when said wheel rotates relative to said sensor;

an output circuit;

an input circuit connected across said pick-up coil including in a series connection a first resistor, a diode and a second resistor, the anode of said diode connected to one end of said first resistor and the cathode of said diode connected to one end of said second resistor, said diode preventing current flow through said second resistor until the voltage applied to said diode in a forward direction exceeds a predetermined voltage;

a digital-to-analog converter having an input and an output for providing a voltage threshold;

means responsive to the rotation of said wheel for detecting decceleration of said wheel and providing a detected deceleration output signal indicative thereof;

a binary pulse counter developing a digital count signal and for applying said digital signal to the input of said digital-to-analog converter, said counter having a selectable count signal that may be reduced in response to said detected deceleration output signal to reduce said threshold voltage to accommodate decelerations of the wheel;

first and second voltage comparators, each of said voltage comparators having input terminals and an output terminal, means connecting the input terminals of said first comparator respectively to the anode of said diode and to the output of said converter;

means connecting the input terminals of said second comparator respectively to the cathode of said diode and to the output of said converter;

means coupled to the output of said first comparator for causing a leading rising edge of said square wave voltage pulse to be developed at said output circuit when the magnitude of the voltage at the anode of said diode has a predetermined relationship to the magnitude of the output voltage of said converter and when said wheel is rotating at a low speed; and means coupled to the output of said second comparator for causing said leading rising edge of said square wave voltage pulse to be developed at said output circuit when the magnitude of the voltage at the cathode of said diode has a predetermined relationship to the magnitude of the output voltage of said converter when said wheel is rotating at a speed that is higher than said low speed.

13. The apparatus according to claim 12 wherein the pulse counter for developing the digital count signal is a binary up/down pulse counter which executes binary down count operations so as to reduce the threshold voltage when deceleration of the wheel is detected.

14. The apparatus according to claim 12 wherein the pulse counter for developing the digital count signal is a binary counter with a binary shift operation wherein a bit shift is executed so as to reduce the threshold voltage.

15. Apparatus for developing a series of square wave voltage pulses that are developed during rotation of a rotatable wheel comprising:

a magnetic sensor associated with said wheel having a pick-up coil and means on said wheel for causing an alternating voltage to be generated in said pick-up coil when said wheel rotates relative to said sensor;

a digital-to-analog converter having an input and an output for developing an output threshold voltage that is a function of magnitude of a multi-bit digital count signal;

means responsive to the rotation of said wheel for detecting deceleration of said wheel and providing a detected deceleration output signal indicative thereof;

a pulse counter for developing said multi-bit digital signal and means for applying said digital signal to the input of said converter, said counter having means responsive to said detected deceleration output signal for reducing the count signal to decrease the threshold voltage to accommodate said decelerations of the wheel;

means having an output responsive to the relative magnitudes of a first control voltage that is a function of the magnitude of the alternating voltage generated in said coil and the output voltage of said converter for causing a leading rising edge of said square wave to be developed at said output when said control voltage and the output voltage of said converter have predetermined relative magnitudes; and means for causing the magnitude represented by said digital signal to increase when a second control voltage that is a function of the magnitude of the voltage generated in said coil exceeds the output voltage of said converter.

16. The apparatus according to claim 15 wherein the pulse counter for developing the digital count signal is a binary up/down pulse counter which executes binary down count operations so as to reduce the threshold voltage when deceleration of the wheel is detected.

17. The apparatus according to claim 15 wherein the pulse counter for developing the digital count signal is a binary counter with a binary shift operation wherein a bit shift is executed so as to reduce the threshold voltage when deceleration of the wheel is detected.

18. The apparatus according to claim 15 where said first control voltage is higher than said second control voltage.

19. A method for developing a series of square wave voltage pulses that are produced during rotation of a rotatable wheel, said method comprising:

causing an alternating voltage to be generated in a pick up coil when a rotatable wheel rotates relative to a sensor;

comparing the alternating voltage with an analog threshold voltage to detect a leading rising edge;

generating a digital count signal with a binary counter as a function of the amplitude of the alternating voltage;

converting the digital count signal to the analog threshold voltage;

detecting deceleration of said wheel in response to the rotation of said wheel and providing a detected deceleration output signal indicative thereof;

reducing the digital count signal in the counter in response to said detected deceleration output signal so as to reduce the threshold voltage so that sudden decelerations do not go undetected; and producing said series of square wave pulses in response to the leading rising edge.

20. The method according to claim 19 wherein said step of reducing the count signal includes counting down at least one count decrement with an up/down counter.

21. The method according to claim 19 wherein the step of reducing the count signal includes performing at least a one bit shift in a shiftable binary counter.

* * * * *